United States Patent [19]
New

[11] Patent Number: 5,999,025
[45] Date of Patent: Dec. 7, 1999

[54] PHASE-LOCKED LOOP ARCHITECTURE FOR A PROGRAMMABLE LOGIC DEVICE

[75] Inventor: Bernard J. New, Los Gatos, Calif.

[73] Assignee: Xilinx, Inc., San Jose, Calif.

[21] Appl. No.: 09/049,853

[22] Filed: Mar. 27, 1998

[51] Int. Cl.[6] ................................................. H03L 7/06
[52] U.S. Cl. .......................... 327/156; 327/159; 327/292
[58] Field of Search .................................. 327/156–159, 327/149, 150, 292, 293, 295, 296, 297, 564, 565; 326/101; 395/558; 713/503

[56] References Cited

U.S. PATENT DOCUMENTS

| | | | |
|---|---|---|---|
| 5,075,575 | 12/1991 | Shizukuishi et al. ................. | 331/1 A |
| 5,359,727 | 10/1994 | Kurita et al. ........................... | 395/550 |
| 5,420,544 | 5/1995 | Ishibashi ................................ | 331/11 |
| 5,537,068 | 7/1996 | Konno .................................... | 327/115 |
| 5,550,783 | 8/1996 | Stephens, Jr. et al. ................ | 365/233 |
| 5,642,058 | 6/1997 | Trimberger et al. .................. | 326/41 |
| 5,670,903 | 9/1997 | Mizuno ................................... | 327/158 |
| 5,777,498 | 7/1998 | Cometti et al. ........................ | 327/156 |

OTHER PUBLICATIONS

"The Programmable Logic Data Book" published 1994, available from Xilinx, Inc., 2100 Logic Drive, San Jose, California 95124, pp. 2–5 to 2–102.

*Primary Examiner*—Tuan T. Lam
*Attorney, Agent, or Firm*—E. Eric Hoffman; Jeanette S. Harms

[57] ABSTRACT

A programmable logic device (PLD) which includes a phase comparator in addition to the conventional configurable logic circuitry normally present in the PLD. The configurable logic circuitry of the PLD includes a clock distribution circuit which is configured to route a clock signal $VCO_{OUT}$ generated by a voltage controlled oscillator (VCO) throughout the PLD as a distributed clock signal (DIST_CLK). The DIST_CLK signal is used to clock the output registers which route data values out of the PLD. The DIST_CLK signal is also provided to the phase comparator. The phase comparator is also coupled to receive a clock signal $CLK_{IN}$ from an external device. In response, the phase comparator generates an error signal which is representative of the phase difference between the $CLK_{IN}$ and DIST_CLK signals. This error signal is provided to a loop filter. In response, the loop filter generates a control signal, which in turn, controls the frequency of the $VCO_{OUT}$ signal generated by the VCO. The frequency of the $VCO_{OUT}$ signal is controlled such that the DIST_CLK signal is synchronized with the $CLK_{IN}$ signal.

12 Claims, 13 Drawing Sheets

PHASE-LOCKED LOOP ARCHITECTURE FOR A PROGRAMMABLE LOGIC DEVICE

BACKGROUND OF THE INVENTION

1. Field of the Invention

The present invention relates to an architecture for a phase-locked loop (PLL) circuit. More specifically, the present invention relates to a PLL circuit that compensates for the distribution delay experienced by a clock signal as it is routed through a programmable logic device, such as a field programmable gate array (FPGA).

2. Related Art

FIG. 1 is a block diagram of a conventional phase-locked loop (PLL) circuit 100. PLL circuit 100 includes voltage controlled oscillator (VCO) 101, phase comparator 102 and loop filter 103. VCO 101 generates an output clock signal, $VCO_{OUT}$, in response to a frequency control voltage provided by loop filter 103. VCO 101 is an analog device which is designed to generate a $VCO_{OUT}$ signal having a frequency which is controllable within a range about a desired frequency. The $VCO_{OUT}$ signal is provided to phase comparator 102. Phase comparator 102 is also coupled to receive a reference clock signal $CLK_{REF}$. Phase comparator 102 determines the phase difference between the $VCO_{OUT}$ and $CLK_{REF}$ signals, and in response, generates an error signal (ERROR) which is representative of this phase difference. Loop filter 103 integrates the ERROR signal, thereby creating the frequency control voltage. The frequency control voltage, in turn, controls the frequency of the $VCO_{OUT}$ signal generated by VCO 101.

If the $VCO_{OUT}$ signal lags in phase with respect to the $CLK_{REF}$ signal, then phase comparator 102 generates an ERROR signal having a first logic level (e.g., $V_{CC}$). Loop filter 103 integrates this ERROR signal to create the frequency control voltage. This frequency control voltage, when applied to VCO 101, causes the frequency of the $VCO_{OUT}$ signal to increase, thereby causing the $VCO_{OUT}$ signal to gain in phase with respect to the $CLK_{REF}$ signal.

Similarly, if the $VCO_{OUT}$ signal leads in phase with respect to the $CLK_{REF}$ signal, then phase comparator 102 generates an ERROR signal having a second logic level (e.g., $V_{SS}$). Loop filter 103 integrates this ERROR signal to create the frequency control voltage. This frequency control voltage, when applied to VCO 101, causes the frequency of the $VCO_{OUT}$ signal to decrease, thereby causing the $CLK_{REF}$ signal to gain in phase with respect to the $VCO_{OUT}$ signal.

In the foregoing manner, PLL circuit 100 continuously adjusts the frequency of the $VCO_{OUT}$ signal to eliminate any phase difference between the $CLK_{REF}$ and $VCO_{OUT}$ signals. The operating parameters of VCO 101, phase comparator 102 and loop filter 103 are selected to provide a stable closed loop control system. As a result, PLL circuit 100 ultimately eliminates the phase difference between the $VCO_{OUT}$ and CLK signals. At this time, the $VCO_{OUT}$ and $CL_{REF}$ signals will be matched in both frequency and phase (i.e., synchronized). Under these conditions, PLL circuit 100 is said to be "locked". PLL circuit 100 remains locked by continual small adjustments of VCO 101 based on the feedback received from phase comparator 102 and loop filter 103.

One application of PLL circuit 100 is to compensate for clock distribution delays which occur within application specific integrated circuits (ASICs).

FIG. 2 is a block diagram of a conventional ASIC 200 which operates in response to an input clock signal $CLK_{IN}$. The $CLK_{IN}$ signal is routed through an input buffer circuit 201 to internal circuitry 202 of the ASIC. While traveling through internal circuitry 202, the $CLK_{IN}$ signal experiences a clock distribution delay ($t_{dd}$) thereby resulting in a distributed clock signal DIST_CLK. The DIST_CLK signal clocks data values $D_{IN}$ through output register 203 as output data values $D_{OUT}$. A clock-to-out delay ($t_{co}$) exists from the time the DIST_CLK signal is applied to output register 203 until the time that a corresponding data value $D_{OUT}$ is provided out of output register 203.

FIG. 3 is a waveform diagram illustrating $CLK_{IN}$ signal 301, DIST_CLK signal 302 and $D_{OUT}$ signal 303, as well as the clock distribution delay $t_{dd}$ and the clock-to-out delay, $t_{co}$. As illustrated in FIG. 3, the clock distribution delay, $t_{dd}$ and the clock-to-out delay $t_{co}$ are cumulative, such that the total delay ($t_{total}$) from the time that the $CLK_{IN}$ signal is received until the time that the data value $D_{OUT}$ is output is equal to $t_{dd}$ plus $t_{co}$.

In order to reduce the total delay $t_{total}$, certain ASICs, such as ASIC 200, have implemented an on-chip PLL circuit in the manner illustrated in FIG. 4. In this circuit, VCO 101 provides the $VCO_{OUT}$ signal to internal circuitry 202. The $VCO_{OUT}$ signal undergoes the previously described clock distribution delay $t_{dd}$, thereby creating the distributed clock signal, DIST_CLK. The DIST_CLK signal is used to clock data values $D_{OUT}$ out of output register 203.

The DIST_CLK signal is also provided to an input terminal of phase comparator 102. The other input terminal of phase comparator 102 is coupled to receive the $CLK_{IN}$ signal from input buffer 201. In response, phase comparator 102 generates an ERROR signal that is representative of the phase difference between the $CLK_{IN}$ and DIST_CLK signals. This ERROR signal is integrated by loop filter 103 to create the frequency control voltage. The frequency control voltage, in turn, controls the frequency of the $VCO_{OUT}$ signal generated by VCO 101. The $VCO_{OUT}$ signal is controlled such that the DIST_CLK signal becomes synchronized with the $CLK_{IN}$ signal.

FIG. 5 is a waveform diagram illustrating $CLK_{IN}$ signal 501, $VCO_{OUT}$ signal 502, DIST_CLK signal 503 and $D_{OUT}$ signal 504 as generated within ASIC 200 of FIG. 4. As previously stated, the PLL circuitry causes DIST_CLK signal 503 to be synchronized with $CLK_{IN}$ signal 501. As a result, the total delay $t_{total}$ from the time that the $CLK_{IN}$ signal 501 is received until the data value $D_{OUT}$ is output is equal to the clock-to-out time $t_{co}$ of output register 203. The clock distribution delay $t_{dd}$ is effectively hidden by causing the $VCO_{OUT}$ signal 502 to lead the DIST_CLK signal 503 by a time period which is exactly equal to the clock distribution delay $t_{dd}$.

It is possible to implement a PLL circuit on ASIC 200 because the desired operating frequency of ASIC 200 is well defined. The operating frequency of ASIC 200 is selected during the design of the ASIC. VCO 101, phase comparator 102 and loop filter 103 are designed to operate at this predetermined operating frequency. For example, ASIC 200 may be designed to operate at 100 MHz. In such an example, VCO 101 might generate a $VCO_{OUT}$ signal which varies between 90 and 110 MHz (i.e., 100 MHz +/–10 percent). The operating frequency of ASIC 200 could not subsequently be changed to 50 MHz because VCO 101 is not capable of generating an appropriate $VCO_{OUT}$ clock signal.

Field programmable gate arrays (FPGAs) are programmable logic devices that can be configured to perform different logic functions. The operating frequency of an FPGA is not limited in the same manner as the operating frequency of an ASIC. That is, an FPGA is a digital circuit that is designed to be operated in response to many different input clock frequencies. Because PLL circuits are limited to operating within a relatively narrow range of frequencies, it is not practical to implement a PLL circuit on the same chip as an FPGA. Implementing a PLL circuit on an FPGA would undesirably limit the operating frequency of the FPGA to the operating frequency of the PLL circuit.

An alternative would be to include a mechanism on the FPGA to modify the operating frequency of the PLL circuit. However, the programmable mechanisms available in an FPGA are digital in nature. As a result, selected circuit elements would have to be either connected or disconnected using transistor switches to configure different PLL circuits when the FPGA is operated at different frequencies. This method of digital configuration is inappropriate for making the fine adjustments required to modify the operating frequency of a PLL circuit.

For the foregoing reasons, PLL circuits have not typically been implemented on the same chips as FPGAs.

In the instances where PLL circuits have been used with FPGAs, the entire PLL circuit (i.e., VCO 101, phase comparator 102 and loop filter 103) has been located on a chip which is separate from the FPGA chip. However, the delays resulting from transmitting the various signals across the FPGA chip interface cause a loss in performance.

It would therefore be desirable to have an improved method and structure for operably coupling a PLL circuit with an FPGA.

SUMMARY

Accordingly, the present invention provides a programmable logic device (PLD), such as a field programmable gate array (FPGA), which includes a phase comparator in addition to the conventional configurable logic circuitry normally present in the PLD. The phase comparator is a digital circuit that is largely insensitive to operating frequency, and which can easily be fabricated on the same chip as the configurable logic circuitry of the PLD. The configurable logic circuitry of the PLD includes a clock distribution circuit for routing an external clock signal throughout the PLD as one or more distributed clock signals (DIST_CLK) with minimum skew. The DIST_CLK signal is used to clock the output registers which route data values out of the PLD.

The PLD is coupled to one or more external devices to create a PLL circuit. More specifically, the PLD is coupled to an external circuit, such as an ASIC, which provides an external clock signal $CLK_{IN}$, an external loop filter and an external voltage controlled oscillator (VCO) circuit. These external devices are fabricated on one or more chips which are separate from the PLD chip.

The clock distribution circuit of the PLD is coupled to receive a clock signal $VCO_{OUT}$ generated by the external VCO circuit. The clock distribution circuit provides the DIST_CLK signal in response to the $VCO_{OUT}$ signal. The phase comparator of the PLD is coupled to receive the DIST_CLK signal and the external $CLK_{IN}$ signal. In response, the phase comparator generates an ERROR signal which is representative of the phase difference between the DIST_CLK signal and the external $CLK_{IN}$ signal. The ERROR signal is transmitted off of the PLD chip to the external loop filter. The external loop filter processes the ERROR signal to create a frequency control voltage. The frequency control voltage is provided to the external VCO circuit. In response, the external VCO circuit adjusts the frequency of the $VCO_{OUT}$ signal until the DIST_CLK signal is synchronized with the $CLK_{IN}$ signal, thereby completing the PLL circuit.

Because the DIST_CLK signal is synchronized with the $CLK_{IN}$ signal, the data values are effectively clocked out of the PLD in synchronism with the $CLK_{IN}$ signal, thereby reducing the total output delay $t_{total}$ to the clock-to-out delay $t_{co}$ of the output registers.

The phase comparator included on the PLD is capable of operating in response to a wide range of frequencies. As a result, the PLD is advantageously capable of operating in response to $CLK_{IN}$ signals having many different frequencies. To accommodate a $CLK_{IN}$ signal having a different frequency, a different VCO and a different loop filter, appropriate for the new frequency, are selected.

The PLD of the present invention advantageously allows the DIST_CLK signal to remain on the PLD chip for comparison with the $CLK_{IN}$ signal, rather than having to route the DIST_CLK signal off of the PLD chip. This results in improved performance of the resulting PLL circuit.

The present invention will be more fully understood in view of the following description and drawings.

DETAILED DESCRIPTION

Figure 1:
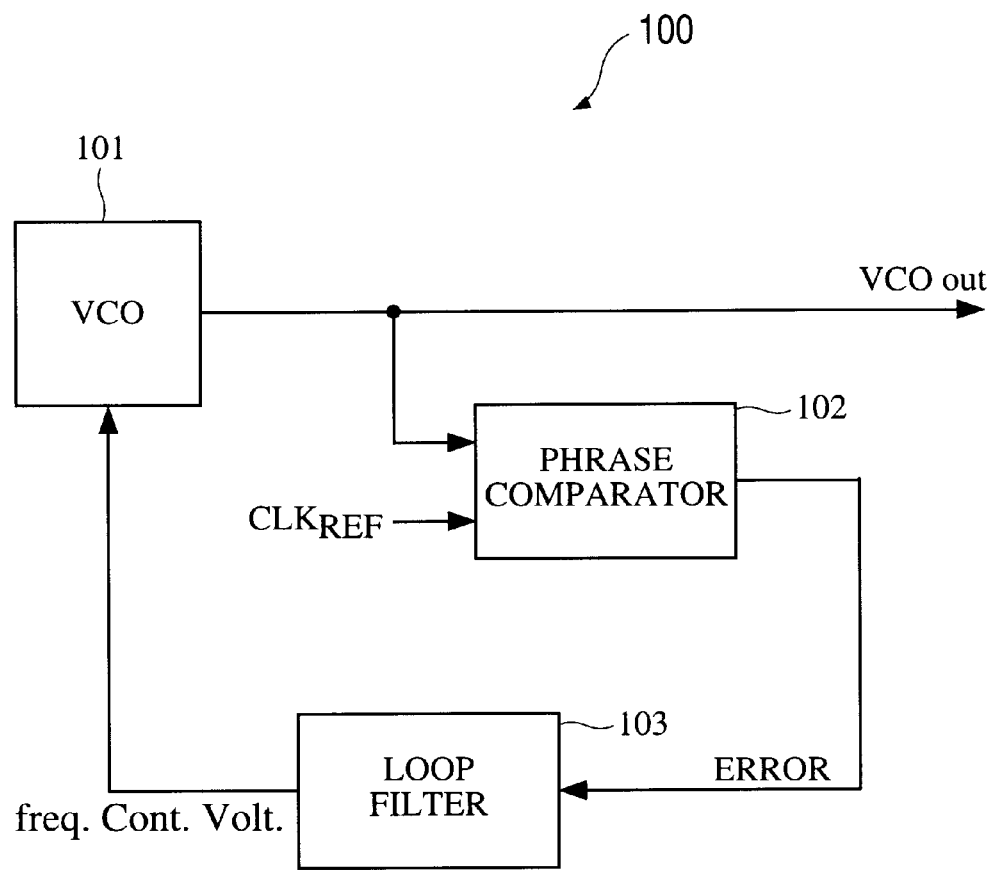
FIG. 1 is a block diagram of a conventional phase-locked loop (PLL) circuit.
Figure 2:
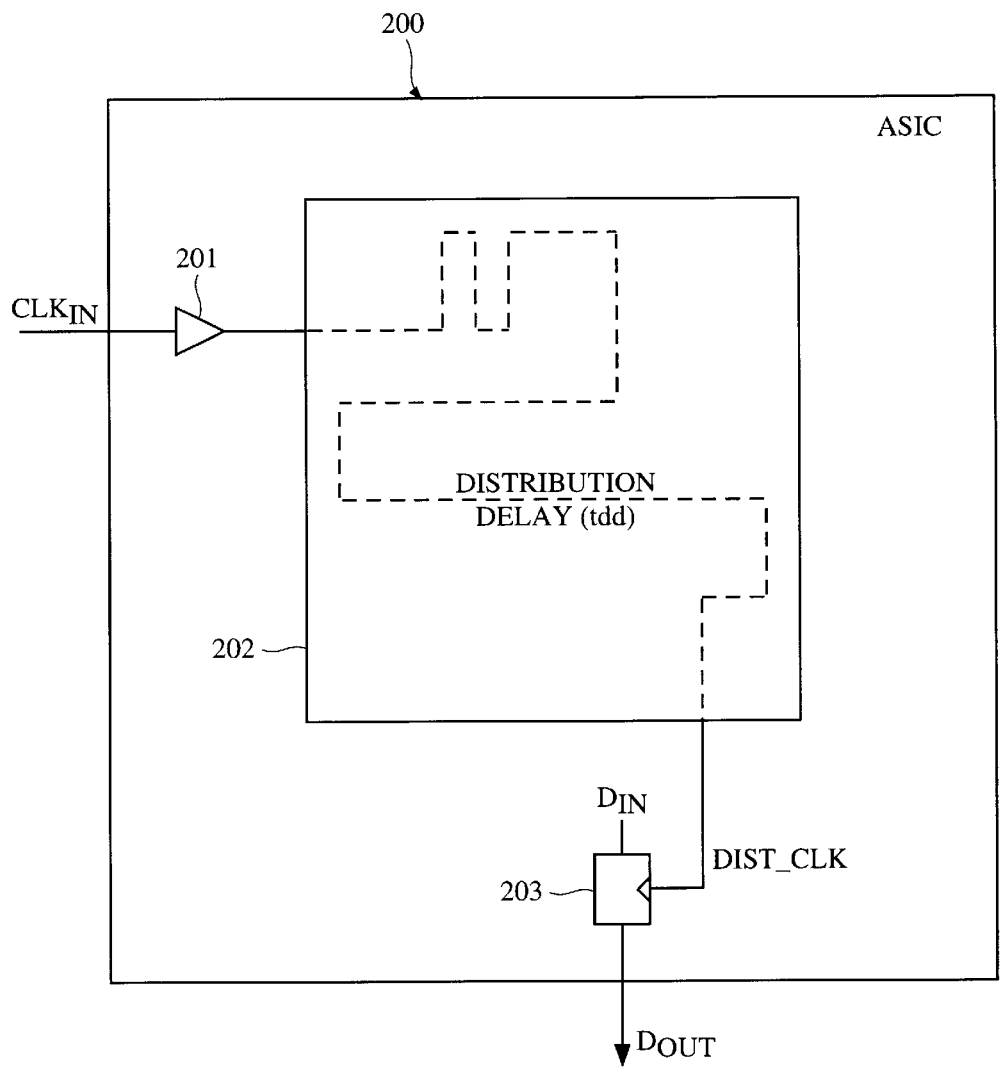
FIG. 2 is a block diagram of a conventional ASIC which operates in response to an input clock signal $CLK_{IN}$.
Figure 3:
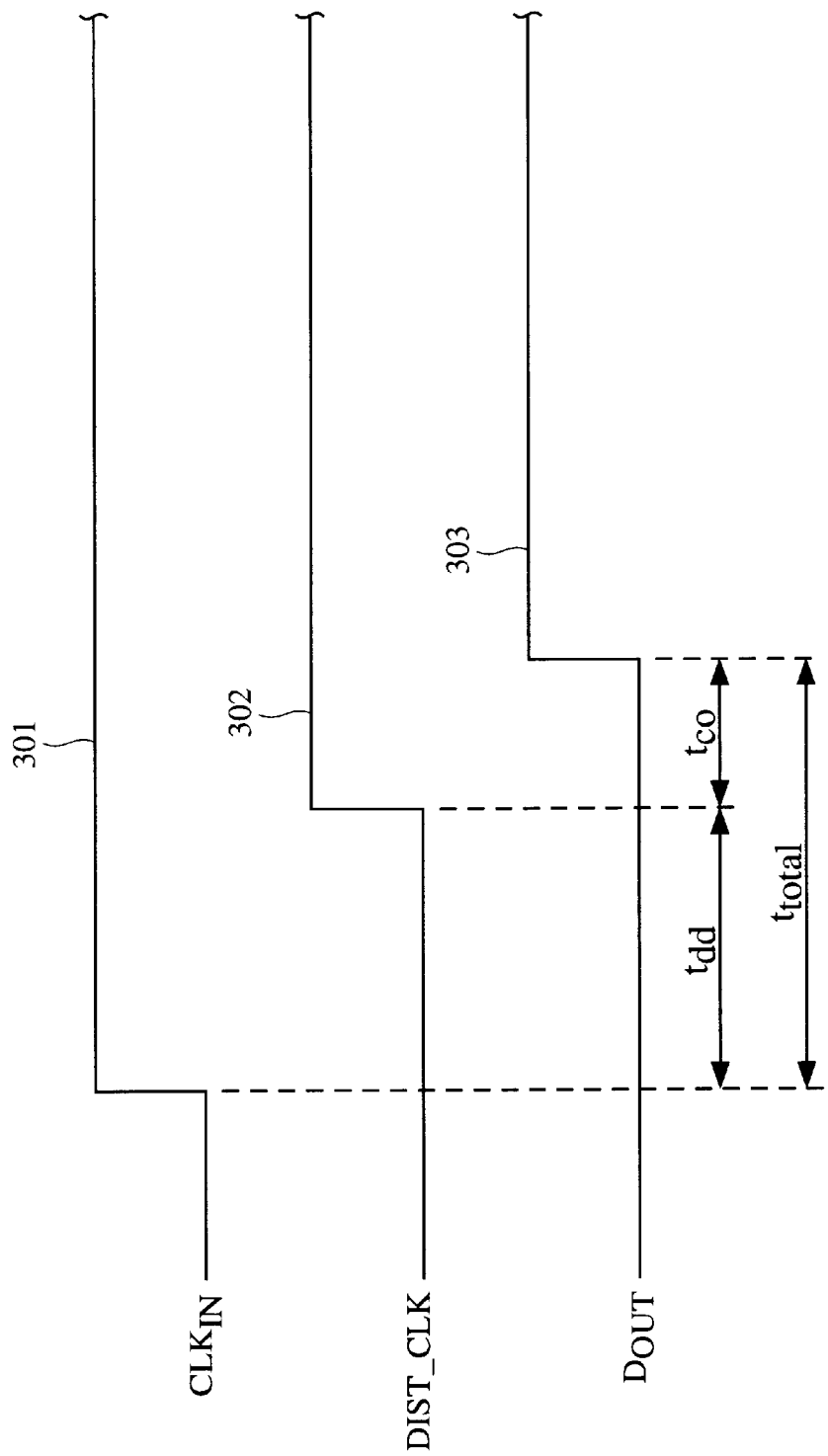
FIG. 3 is a waveform diagram illustrating various signals in the ASIC of FIG. 2.
Figure 4:
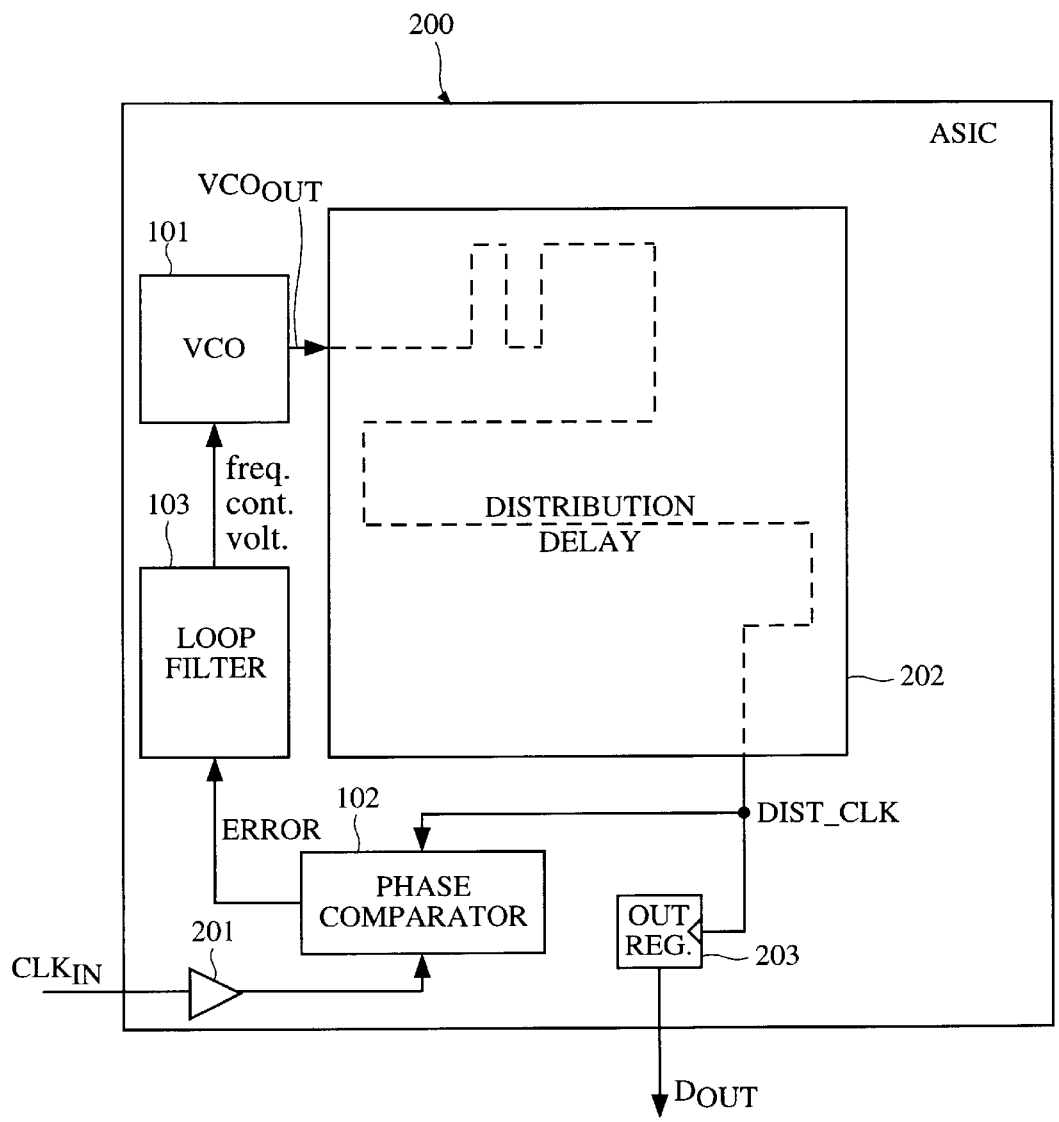
FIG. 4 is a circuit diagram of a conventional ASIC which includes a PLL circuit.
Figure 5:
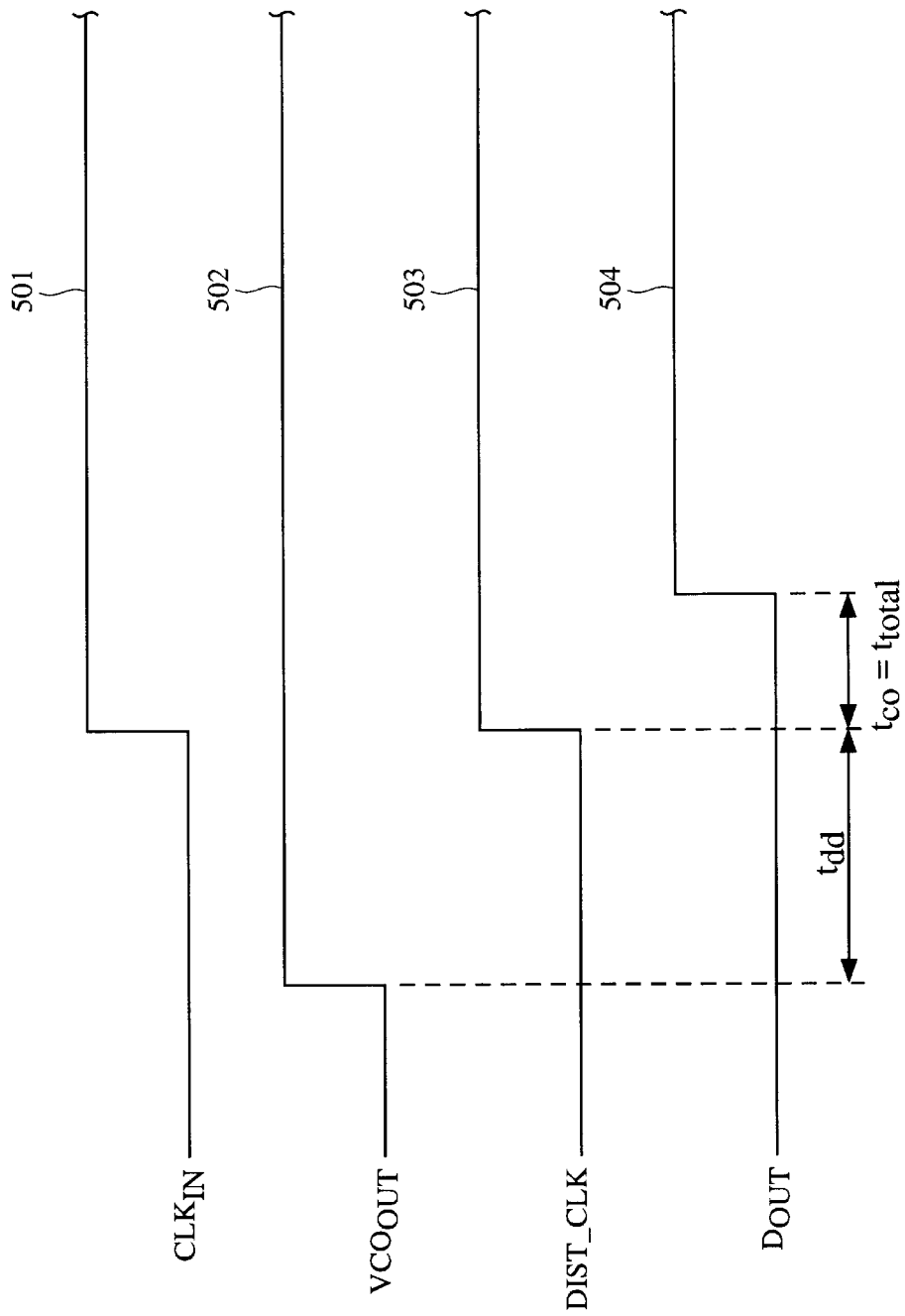
FIG. 5 is a waveform diagram illustrating various signals in the ASIC of FIG. 4.
Figure 6:
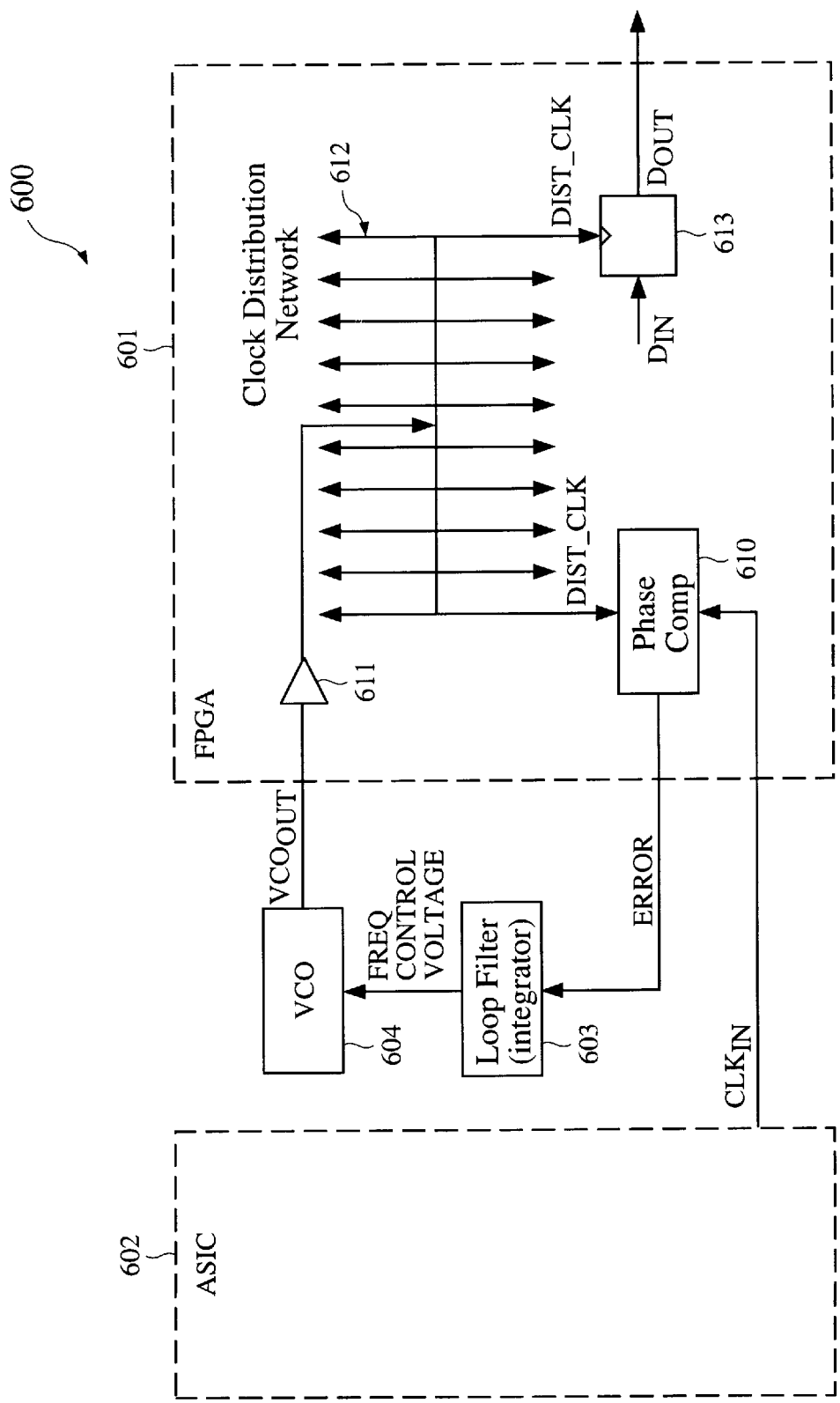
FIG. 6 is a block diagram of a system which includes an FPGA, ASIC, loop filter and VCO in accordance with one embodiment of the present invention.

FIG. 6 is a block diagram of a system 600 in accordance with one embodiment of the present invention. System 600 includes FPGA 601, ASIC 602, loop filter 603 and VCO 604. Phase comparator 610, input buffer 611, clock distribution network 612 and output register 613 are fabricated on FPGA 601. VCO 604 provides a clock signal $VCO_{OUT}$ to input buffer 611 of FPGA 601. The $VCO_{OUT}$ signal is routed through input buffer 611 to clock distribution network 612. As described in more detail below, clock distribution network 612 routes the $VCO_{OUT}$ clock signal throughout the FPGA with minimum skew. A distributed clock signal DIST_CLK is available at destinations throughout the clock distribution network. In particular, the DIST_CLK signal is used to clock data values out of FPGA 601. For example, the DIST_CLK signal is used to clock the input data values $D_{IN}$ through output register 613 as the data output signals $D_{OUT}$.

The DIST_CLK signal is also provided to an input terminal of phase comparator 610. An external non-PLD device (or a group of non-PLD devices), represented herein by ASIC 602, provides an external clock signal $CLK_{IN}$ to the other input terminal of phase comparator 610. In response, phase comparator 610 generates an ERROR signal which is representative of the phase difference between the DIST_CLK signal and the $CLK_{IN}$ signal. The ERROR signal is provided to loop filter 603. Loop filter 603, in response, generates a frequency control voltage signal which is provided to VCO 604. The frequency control voltage controls the frequency of the $VCO_{OUT}$ signal. The frequency of the $VCO_{OUT}$ signal is controlled to eliminate any phase difference between the DIST_CLK signal and the $CLK_{IN}$ signal. The use of feedback to achieve this synchronization automatically compensates for variations in process, temperature and supply voltage. The delay introduced by clock distribution network 612 does not need to be known ahead of time.

Because the DIST_CLK signal is synchronized with the $CLK_{IN}$ signal, the data values are effectively clocked out of output register 613 in synchronism with the $CLK_{IN}$ signal. As a result, the total delay $t_{total}$ which occurs from the time the $CLK_{IN}$ signal is received until the data value $D_{OUT}$ is output from FPGA 601 is equal to the clock-to-out delay $t_{co}$ of output register 613. The total delay $t_{total}$ is therefore advantageously minimized within FPGA 601.

As described in more detail below, phase comparator 610 is a digital circuit which is capable of operating in response to input clock signals having various frequencies. As a result, providing phase comparator 610 on the same chip as FPGA 601 enables FPGA 601 to operate in response to $CLK_{IN}$ signals having various frequencies. For example, if ASIC 602 provides a $CLK_{IN}$ signal having a frequency of 100 MHz, then loop filter 603 and VCO 604 are selected to accommodate an operating frequency of 100 MHz. That is, loop filter 603 is specifically selected to provide the appropriate transfer function for a system having an operating frequency of 100 MHz. Similarly, VCO 604 is selected to provide a $VCO_{OUT}$ signal that is optimized for operation around 100 MHz +/-10 percent. If ASIC 602 provides a $CLK_{IN}$ signal having a frequency of 50 MHz, then loop filter 603 and 604 are selected in response to this frequency. Thus, appropriate selection of loop filter 603 and VCO 604 enables FPGA 601 to provide a DIST_CLK signal which is synchronized with the $CLK_{IN}$ signal, regardless of the frequency of the $CLK_{IN}$ signal.

The DIST_CLK signal advantageously remains on FPGA 601 for comparison with the $CLK_{IN}$ signal, rather than having to route the DIST_CLK signal off of FPGA 601. This results in improved performance of the resulting PLL circuit as will be described in further detail in reference to FIG. 11.

It is important to note that FPGA 601 is fabricated on a different chip than the other elements of system 600. For example, FPGA 601 and ASIC 602 are fabricated on separate and distinct chips. The $CLK_{IN}$ signal is typically routed from ASIC 602 to FPGA 601 by a trace on a printed circuit board.

Figure 6A:
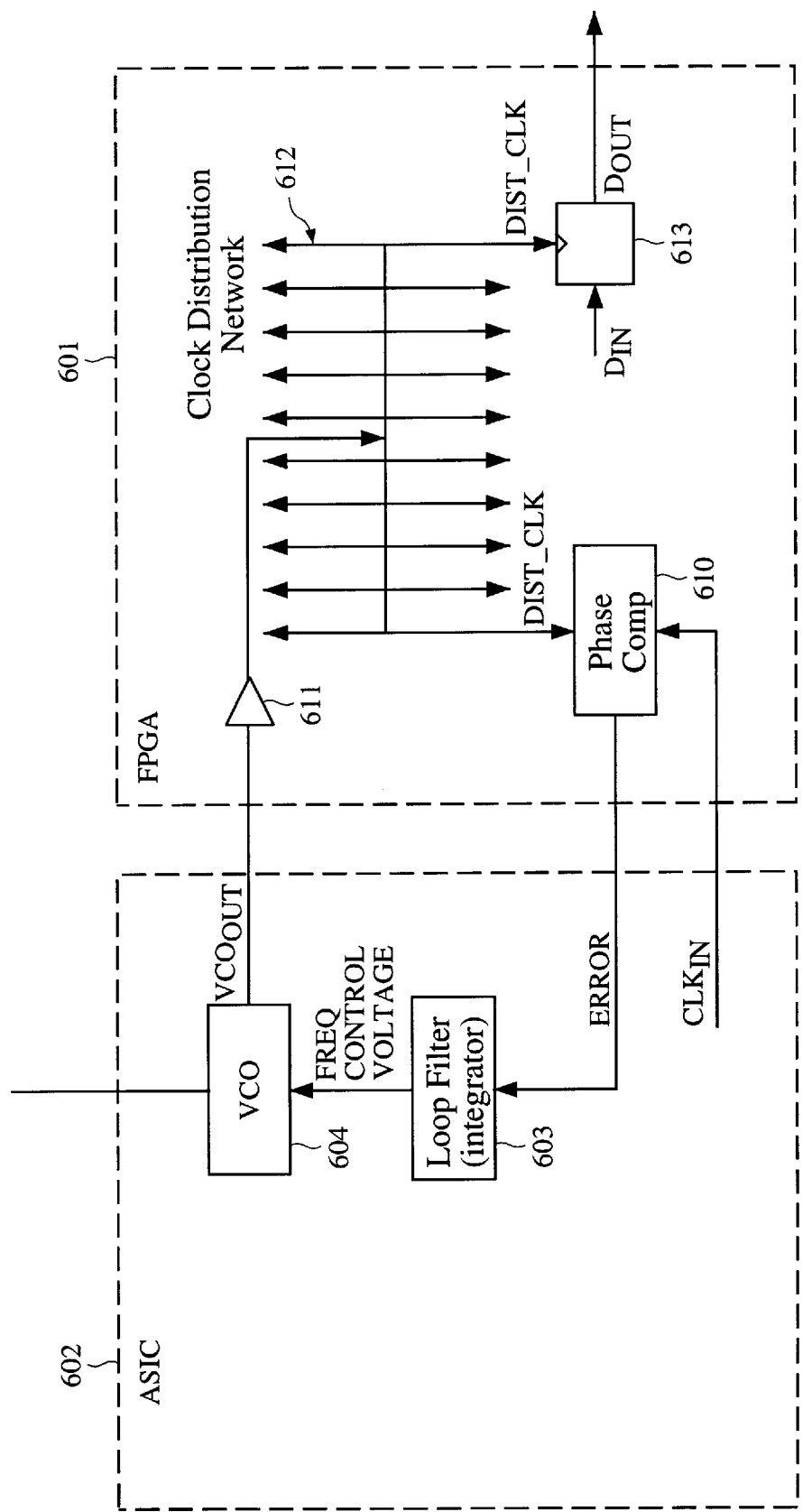
FIG. 6A is a block diagram of a system which includes an FPGA, ASIC, loop filter and VCO in accordance with another embodiment of the present invention.

It is also important to note that loop filter 603 and VCO 604 are external to FPGA 601. Loop filter 603 and VCO 604 can both be fabricated on the same integrated circuit chip, separate from FPGA 601. Alternatively, loop filter 603 can be fabricated on one separate chip, and VCO 604 can be fabricated on another separate chip. In one embodiment, loop filter 603 and VCO 604 are fabricated as mask programmable devices, in which the operating characteristics of loop filter 603 and VCO 604 are determined by selectively fabricating the interconnect patterns of the various conductive layers to form resistors and/or capacitors of varying values. In yet another embodiment, one or both of loop filter 603 and VCO 604 are fabricated on the same silicon as ASIC 602. (See FIG. 6A) In general, VCO 604 and loop filter 603 are fabricated using a semiconductor process that is optimized for the fabrication of analog circuitry (i.e., an analog semiconductor process). Because loop filter 603 and VCO 604 are fabricated on chips which are separate from the FPGA 601, the analog circuitry of loop filter 603 and VCO 604 is not susceptible to interference from noise generated by the digital circuitry of FPGA 601.

Figure 7:
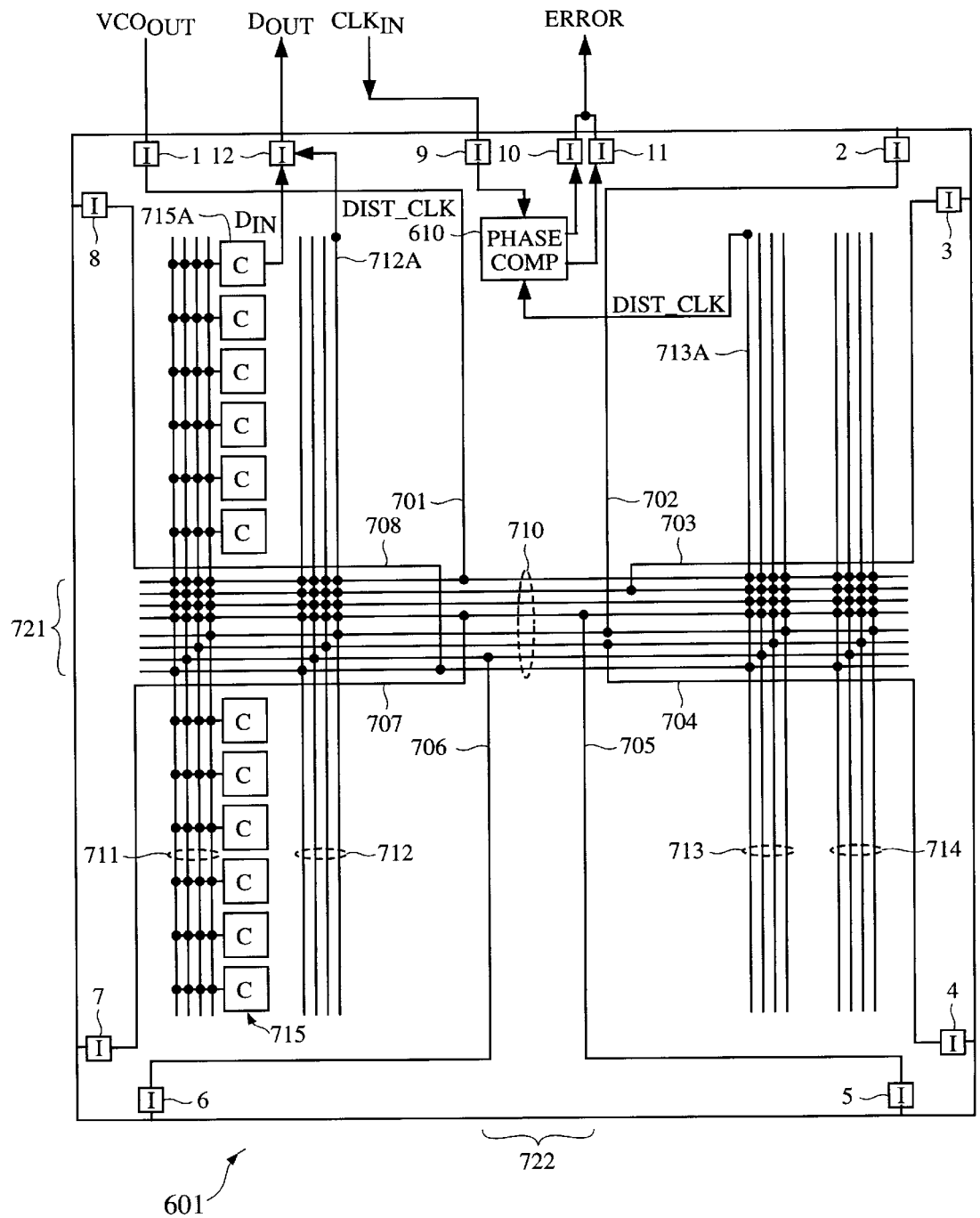
FIG. 7 is a schematic diagram that illustrates the FPGA of FIG. 6 in more detail.

FIG. 7 is a schematic diagram that illustrates FPGA 601 in more detail. The illustrated elements of FPGA 601 include input/output blocks (IOBs) 1–12, clock distribution traces 701–708 and 710–714, configurable logic blocks (CLBs) 715, horizontal center stripe 721, vertical center stripe 722 and phase comparator 610. Many conventional elements of FPGA 601 are not illustrated for purposes of clarity. These non-illustrated elements are well known to those of ordinary skill in the art, and are described in more detail in *The Programmable Logic Data Book*, (PN0401253) (1994) pp. 2–5 to 2–102, available from Xilinx, Inc., 2100 Logic Drive, San Jose, Calif., which is hereby incorporated by reference. For example, additional IOBs (not shown) are located around the perimeter of FPGA 601 to provide an interface for other signals entering and leaving FPGA 601. Moreover, although only one column of CLBs 715 is illustrated, FPGA 601 includes a plurality of columns of CLBs, which form an array of CLBs. In addition, programmable interconnect resources extend between the IOBs and the CLBs, thereby allowing these elements to be connected to form a desired circuit.

Figure 8:
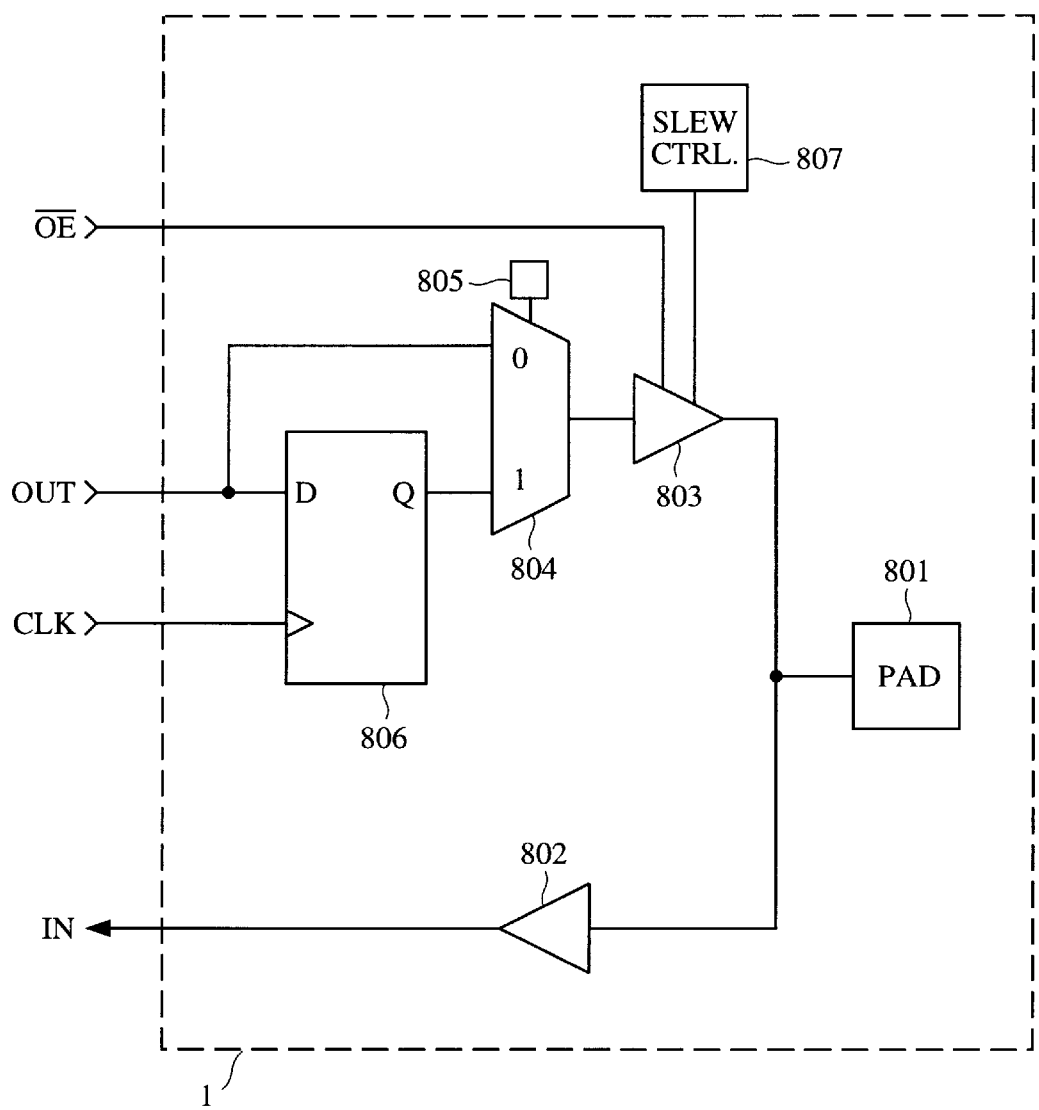
FIG. 8 is a circuit diagram of an input/output block of the FPGA of FIG. 7.

IOBs 1–8 are located at the four corners of FPGA 601 as illustrated. FIG. 8 is a circuit diagram which illustrates IOB 1 in more detail. IOBs 2–8 (and 9–12) are identical to IOB 1. IOB 1 includes pad 801, input buffer 802, tri-state output buffer 803, two-to-one multiplexer 804, configuration memory cell 805, D-Q flip flop 806 and slew control circuit 807. Pad 801 is coupled to the input terminal of input buffer 802. The output terminal of input buffer 802 provides an input signal (IN) to FPGA 601. Pad 801 is also coupled to an output terminal of output buffer 803. The response of output buffer 803 is controlled by a conventional slew rate control circuit 807. Output buffer 803 is a tri-state buffer which is enabled and disabled in response to an output enable (OE bar) signal. More specifically, output buffer 803 is enabled when the OE bar signal has a logic low value, and disabled when the OE bar signal has a logic high value.

One input terminal of multiplexer 804 is coupled to receive an output signal (OUT) from the logic circuitry of the FPGA 601. The other input terminal of multiplexer 804 is coupled to receive the OUT signal as routed through flip flop 806 in response to a clock signal CLK. Multiplexer 804 is configured to pass one of these two OUT signals in response to a configuration data value stored in configuration memory cell 805.

Within IOB 1, pad 801 is coupled to receive the VCO$_{OUT}$ signal provided by VCO 604 (FIG. 6). The VCO$_{OUT}$ signal is routed through input buffer 802 to FPGA 601. Because pad 801 of IOB 1 is used as an input pad, the output circuitry of IOB 1 is disabled by applying a logic high OE bar signal to disable output buffer 803. In other embodiments, any one of IOBs 2–8 can be coupled to receive the VCO$_{OUT}$ signal.

The output terminals of the input buffers of IOBs 1–8 are coupled to clock distribution traces 701–708, respectively, as illustrated in FIG. 7. These clock distribution traces 701–708 extend to a centrally located region of FPGA 601. Within this centrally located region, clock distribution traces 701–708 are coupled to a set of eight corresponding horizontal clock distribution traces 710. These horizontal clock distribution traces 710 are located within horizontal center stripe 721 of FPGA 601. Horizontal center stripe 721 is a region of FPGA 601 which does not contain configurable logic blocks.

Sets of clock distribution traces also extend vertically through FPGA 601. For example, a set of four vertical clock distribution traces 711 extends vertically through FPGA 601, alongside a column of CLBs 715. Programmable connections are provided (as illustrated by empty circles) where the vertical clock distribution traces 711 overlap the horizontal distribution traces 710. Programmable connections are also provided to enable each of the CLBs 715 to be coupled to any one of the four vertical clock distribution traces 711.

Three additional sets of vertical clock distribution traces 712–714 are illustrated. The three columns of CLBs associated with these sets of vertical clock distribution traces 712–714 are not shown for purposes of clarity. However, it is understood that each column of CLBs has a corresponding set of vertical clock distribution traces. It is also understood that there are typically more than four sets of vertical clock distribution traces and corresponding columns of CLBs. In one example, FPGA 601 includes 24 sets of vertical clock distribution traces and 24 corresponding columns of CLBs.

The VCO$_{OUT}$ signal is routed from IOB 1, along clock distribution trace 701, one of horizontal clock distribution traces 710 and vertical clock distribution traces 711–714. The VCO$_{OUT}$ signal is distributed throughout FPGA 601, thereby creating the distributed clock signal DIST_CLK. The DIST_CLK signal is available from any of the vertical clock distribution traces which is coupled to receive the VCO$_{OUT}$ signal. The traces paths are designed such that there is low skew within the clock distribution network. That is, the DIST_CLK signal is routed to all destinations with approximately the same associated delay. Thus, the DIST_CLK signal is provided to all of the IOBs and CLBs and to phase comparator 610 at approximately the same time.

In the described example, the DIST_CLK signal is available from vertical clock distribution trace 712A within the set of vertical clock distribution traces 712. Vertical clock distribution trace 712A is coupled to IOB 12, thereby providing the DIST_CLK signal to IOB 12. IOB 12 is further coupled to receive a data signal DIN from a CLB 715A in the column of CLBs 715. Because IOB 12 is identical to IOB 1 (FIG. 8), the configuration of IOB 12 is described below with reference to the previously described elements of IOB 1. The data input signal DIN is provided to the D input terminal of flip flop 806 of IOB 12 (as the OUT signal). The DIST_CLK signal is provided to the clock input terminal of flip flop 806 of IOB 12 (as the CLK signal). As a result, the data signal DIN is clocked through flip flop 806 as the output data signal Dow in response to the DIST_CLK signal. Multiplexer 804 of IOB 12 is configured to pass the data signal D$_{OUT}$ from the Q output terminal of flip flop 806 to output buffer 803. The OE bar signal is controlled to have a logic low value, therefore enabling output buffer 803 to route the data signal D$_{OUT}$ to pad 801 of IOB 12. In the foregoing manner, the D$_{OUT}$ signal is clocked out of IOB 12 in response to the DIST_CLK signal. The clock-to-out delay $t_{co}$ is equal to the delay introduced by flip flop 806, multiplexer 804 and output buffer 803.

Vertical clock distribution trace 713A is coupled to an input terminal of phase comparator 610, thereby providing the DIST_CLK signal to phase comparator 610. A second input terminal of phase comparator 610 is coupled to receive the CLK$_{IN}$ signal, which is routed through IOB 9. The CLK$_{IN}$ signal is routed through IOB 9 in the same manner that the VCO$_{OUT}$ signal is routed through IOB 1. Alternatively, IOB 9 may differ from IOB 1 to provide minimum delay in routing the VCO$_{OUT}$ signal to phase comparator 610. For example, IOB 9 may consist of a pad which is coupled to phase comparator 610 by a dedicated trace. Phase comparator 610 is a dedicated digital circuit which is fabricated in the vertical center stripe 722 of FPGA 601. Vertical center stripe 722 is a centrally located region of FPGA 601 which does not include CLBs. As described in more detail below, phase comparator 610 generates two output signals in response the CLK$_{IN}$ and DIST_CLK signals. These output signals are provided to IOBs 10 and 11.

Figure 9:
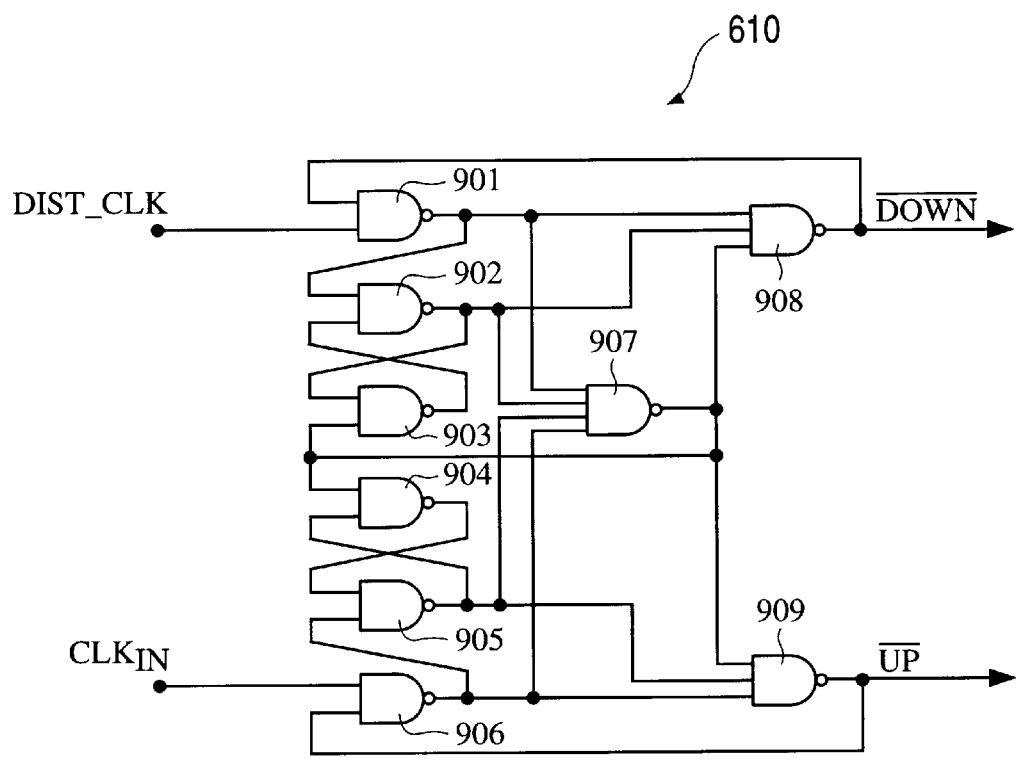
FIG. 9 is a circuit diagram of the phase comparator of FIG. 6 in accordance with one embodiment of the present invention.

FIG. 9 is a circuit diagram of phase comparator 610 in accordance with one embodiment of the present invention. Phase comparator 610 includes NAND gates 901–909, which are coupled as illustrated. The DIST_CLK signal is applied to NAND gate 901 and the CLK$_{IN}$ signal is applied to NAND gate 906. Phase comparator 610 is a well-known circuit, originally introduced in the early 1970s by Motorola as the Motorola MC4044. Phase comparator 610 generates an UP bar signal and a DOWN bar signal in response to the DIST_CLK and CLK$_{IN}$ signals. The UP bar signal is pulsed at a logic low value during the time periods which exist between consecutive edges of the DIST_CLK and CLK$_{IN}$ signals when the DIST_CLK signal lags the CLK$_{IN}$ signal. Under these conditions, the width of each UP bar signal pulse is equal to the time period by which the DIST_CLK signal lags the CLK$_{IN}$ signal.

Similarly, the DOWN bar signal is pulsed at a logic low level during the time periods which exist between consecutive edges of the DIST_CLK and CLK$_{IN}$ signals when the DIST_CLK signal leads the CLK$_{IN}$ signal. Under these conditions, the width of each DOWN bar signal pulse is equal to the time period by which the DIST_CLK signal leads the CLK$_{IN}$ signal.

Because the pulse durations of the UP bar and DOWN bar signals are equal to time differences between respective edges of the DIST_CLK and CLK$_{IN}$ signals, the UP bar and DOWN bar signals are proportional to the phase difference between the DIST_CLK signal and the CLK$_{IN}$ signal. The multiple feedback network of phase comparator 610 assures proper operation even with large frequency errors.

Figure 10:
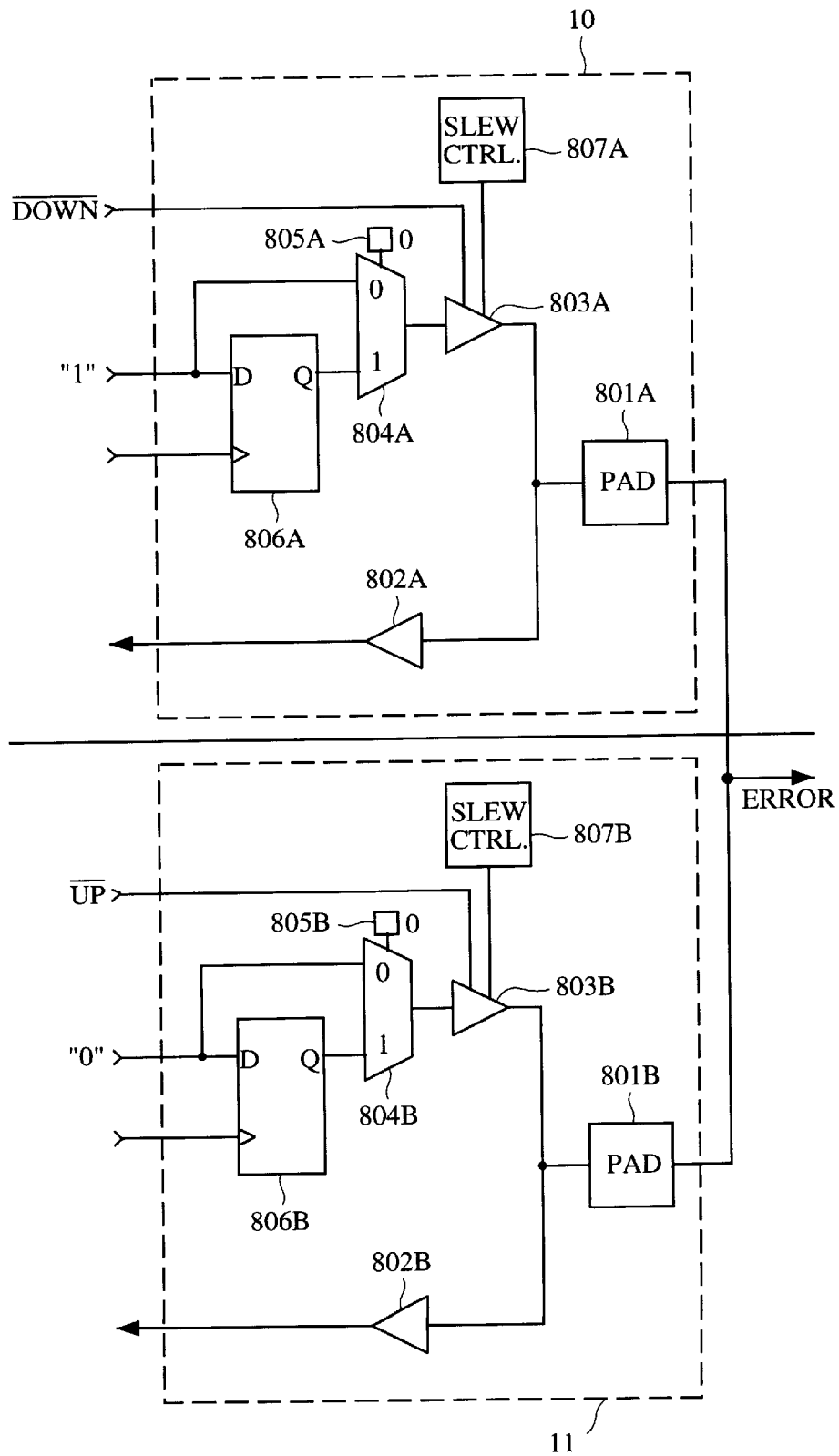
FIG. 10 is a circuit diagram illustrating the configuration of the IOBs which are coupled to the phase comparator of FIG. 6.

The DOWN bar and UP bar signals are provided to IOBs 10 and 11, respectively (FIG. 7). FIG. 10 is a circuit diagram illustrating IOBs 10 and 11. IOB 10 includes pad 801A, input buffer 802A, tri-state output buffer 803A, two-to-one multiplexer 804A, configuration memory cell 805A, D-Q flip flop 806A and slew control circuit 807A. Similarly, IOB 11 includes pad 801B, input buffer 802B, tri-state output buffer 803B, two-to-one multiplexer 804B, configuration memory cell 805B, D-Q flip flop 806B and slew control circuit 807B. These elements of IOBs 10 and 11 have been described above in connection with FIG. 8.

Multiplexer 804A is configured to route a logic "1" to the input terminal of output buffer 803A. The DOWN bar signal is applied to tri-state control terminal of output buffer 803A as the OE bar signal. When the DOWN bar signal has a logic low value, output buffer 803A is enabled, thereby causing pad 801A of IOB 10 to be driven to $V_{CC}$. When the DOWN bar signal has a logic high value, output buffer 803A is disabled, thereby leaving pad 801A of IOB 10 in a floating condition.

Similarly, multiplexer 804B is configured to route a logic "0" to the input terminal of output buffer 803B. The UP bar signal is provided to the tri-state control terminal of output buffer 803B. When the UP bar signal has a logic low value, output buffer 803B is enabled, thereby causing pad 801B of IOB 11 to be driven to ground. When the UP bar signal has a logic high value, output buffer 803B is disabled, thereby leaving pad 801B of IOB 11 in a floating condition.

The output terminals of IOBs 10 and 11 are connected, thereby effectively summing the output signals provided at pads 801A and 801B. The sum of these output signals is provided as the ERROR signal. In the described example, pads 801A and 801B are connected by traces of a printed circuit board, external to FPGA 601. In other embodiments, pads 801A and 801B can be connected by traces on FPGA 601.

Figure 11:
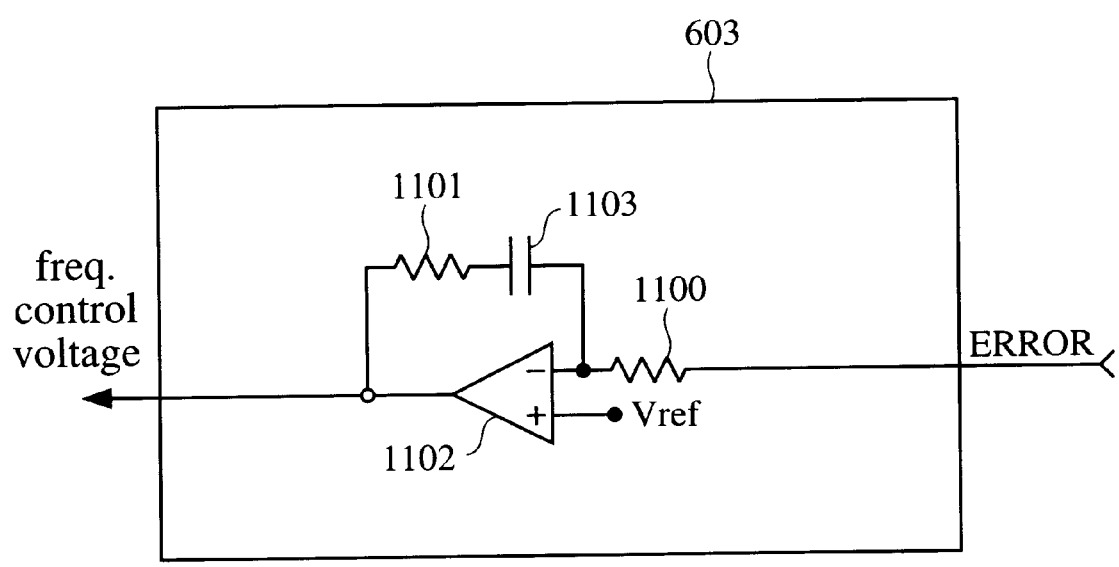
FIG. 11 is a schematic diagram of the loop filter of FIG. 6 in accordance with one embodiment of the present invention.

FIG. 11 is a schematic diagram of loop filter 603, which integrates the ERROR signal received from IOBs 10 and 11, thereby generating the frequency control voltage. Loop filter 603 includes resistors 1100–1101, operational amplifier 1102 and capacitor 1103, which are connected as a conventional analog integrator circuit. More specifically, the ERROR signal is provided to the inverting input terminal of operational amplifier 1102 through resistor 1100. The non-inverting input terminal of operational amplifier 1102 is coupled to a reference voltage $V_{REF}$, which is typically equal to one half of the $V_{CC}$ supply voltage. Resistor 1101 and capacitor 1103 are connected in series between the inverting input terminal of operational amplifier 1102 and the output terminal of operational amplifier 1102. The values and characteristics of resistors 1100–1101, operational amplifier 1102 and capacitor 1103 are selected in a manner known to one of ordinary skill in the art. In other embodiments, other well known integrator circuits can be used in place of the above-described integrator circuit. In yet other embodiments, loop filter 603 may perform operations other than integration (e.g., other low pass filtering operations) as required by the nature of the PLL circuit.

As described above, the frequency control voltage provided by loop filter 603 is generated in response to the ERROR signal. The frequency control voltage changes at a much slower rate than the ERROR signals. As a result, any timing delay introduced by IOBs 10 and 11 in providing the ERROR signal is not critical from a timing perspective. Thus, the delay of the IOBs does not introduce an error in the synchronization of signals $CLK_{IN}$ and DIST_CLK.

Figure 12:
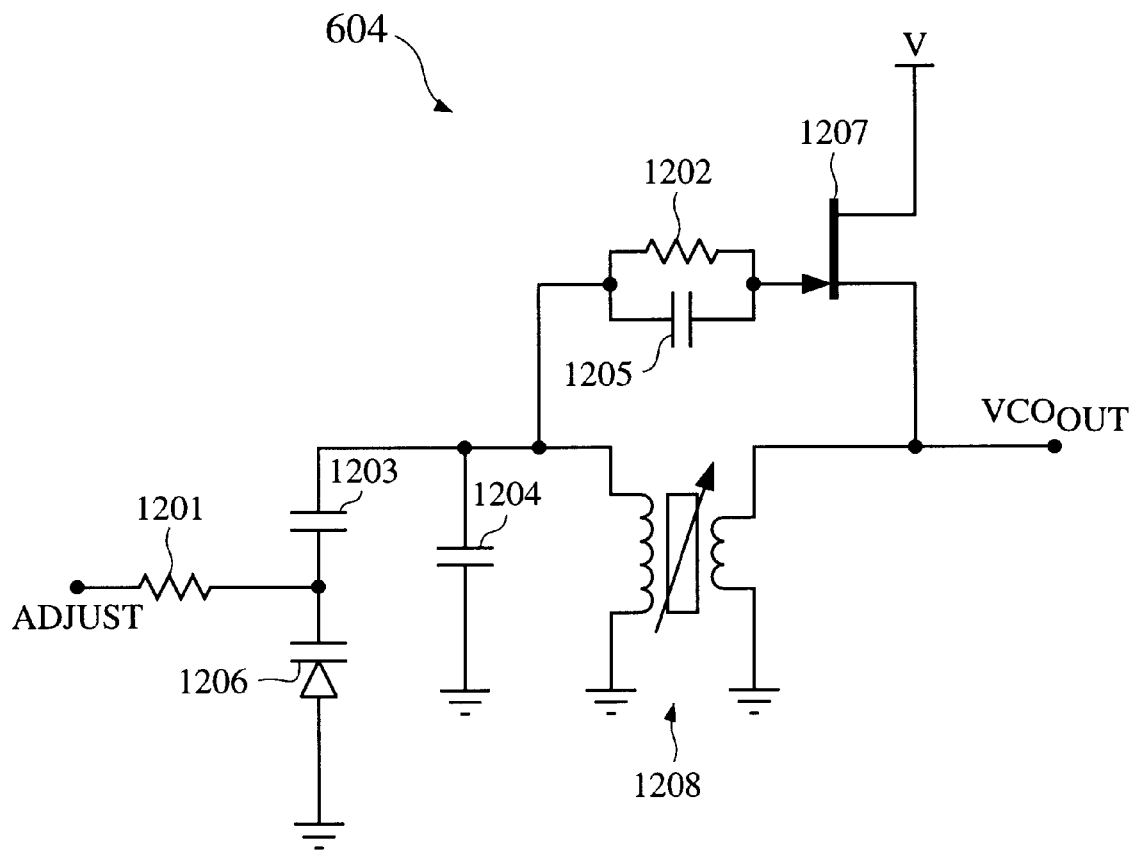
FIG. 12 is a schematic diagram of the VCO of FIG. 6 in accordance with one embodiment of the present invention.

FIG. 12 is a schematic diagram of VCO 604 in accordance with one embodiment of the present invention. VCO 604 is an analog circuit which receives the frequency control voltage from loop filter 603, and in response, generates the $VCO_{OUT}$ signal. In the described embodiment, VCO 604 is a conventional Colpitts oscillator circuit. However, other types of conventional VCOs can be used in other embodiments. VCO 604 includes resistors 1201–1202, capacitors 1203–1205, voltage-variable capacitor (varactor) 1206, n-channel field effect transistor 1207, and variable transformer 1208. The resonant oscillating frequency of VCO 604 (i.e., the frequency of the $VCO_{OUT}$ signal) is determined by the equivalent capacitance of capacitors 1203–1204 and varactor 1206 and the equivalent inductance of transformer 1208. The equivalent capacitance is varied by electrically varying the capacitance of varactor 1206 in response to the frequency control voltage. The capacitance of varactor 1206 decreases as the frequency control voltage increases. As a result, the equivalent capacitance decreases as the frequency control voltage increases. This reduced equivalent capacitance, in turn, increases the resonant oscillating frequency of VCO 604. Conversely, as the frequency control voltage decreases, the capacitance of varactor 1206 increases, thereby increasing the equivalent capacitance and reducing the resonant oscillating frequency of VCO 604. In the foregoing manner, the frequency of the $VCO_{OUT}$ signal is adjusted in response to the frequency control voltage. The values and characteristics of the various elements of VCO 604 are selected in a manner known to one of ordinary skill in the art.

As previously described, both loop filter 603 and VCO 604 are analog devices. Because these devices are fabricated on a different chip than the digital FPGA 601, analog process technology can be used to fabricate loop filter 603 and VCO 604. This results in devices with improved performance when compared with similar devices fabricated with a hybrid process technology.

It is also appreciated by those skilled in the art that minimizing the total delay ($t_{total}$) from the time that the $CLK_{IN}$ signal is received until the time that the data value $D_{OUT}$ is output in accordance with the present invention advantageously results in improved setup and hold times of input flip flops which may be present in the IOBs.

Although the invention has been described in connection with several embodiments, it is understood that this invention is not limited to the embodiments disclosed, but is capable of various modifications which would be apparent to a person skilled in the art. For example, although the $CLK_{IN}$ signal was described as being provided by an ASIC, it is understood that other circuits or devices can be the source of the $CLK_{IN}$ signal. Moreover, although the present invention has been described in connection with an FPGA, it is understood that the present invention is equally applicable to other types of programmable logic devices. Thus, the invention is limited only by the following claims.

I claim:

1. A semiconductor chip comprising:
    a programmable logic device having a clock distribution network for routing a first external clock signal, which is generated off the semiconductor chip, through the programmable logic device, the clock distribution network providing a distributed clock signal in response to the first external clock signal; and
    a phase comparator coupled to receive the distributed clock signal and a second external clock signal, which is generated off the semiconductor chip, the phase comparator generating a first control signal representative of a phase difference between the distributed clock signal and the second external clock signal.

2. The semiconductor chip of claim 1, wherein the programmable logic device further comprises:
    a plurality of configurable input/output blocks (IOBs);
    a plurality of configurable logic blocks (CLBs); and programmable interconnect resources for coupling the IOBs and CLBs.

3. The semiconductor chip of claim 1, wherein the programmable logic device and the phase comparator are digital circuits.

4. The semiconductor chip of claim 1, wherein the phase comparator is configured to operate in response to second external clock signals having different frequencies.

5. A system comprising:

a programmable logic device having a clock distribution network with an associated delay for routing a first external clock signal throughout the programmable logic device, the clock distribution network providing a distributed clock signal in response to the first external clock signal;

a phase comparator coupled to receive the distributed clock signal and a second external clock signal, the phase comparator generating a first control signal representative of a phase difference between the distributed clock signal and the second external clock signal;

a loop filter coupled to receive the first control signal from the phase comparator, the loop filter generating a second control signal in response to the first control signal;

a voltage controlled oscillator coupled to receive the second control signal from the loop filter, the voltage controlled oscillator generating the first external clock signal in response to the second control signal; and a source circuit for providing the second external clock signal, wherein the programmable logic device and the phase comparator are fabricated on a first chip, and the loop filter, voltage controlled oscillator and source circuit are fabricated on one or more other chips.

6. The system of claim 5, wherein the programmable logic device and the phase comparator are fabricated using a digital semiconductor process.

7. The system of claim 5, wherein the loop filter and the voltage controlled oscillator are fabricated using an analog semiconductor process.

8. The system of claim 5, wherein the loop filter and the voltage controlled oscillator are fabricated on the same chip.

9. The system of claim 8, wherein the source circuit is fabricated on the same chip as the loop filter and the voltage controlled oscillator.

10. The system of claim 5, wherein the programmable logic device comprises:

a plurality of configurable input/output blocks (IOBs);

a plurality of configurable logic blocks (CLBs); and programmable interconnect resources extending between the IOBs and CLBs.

11. A method of operating a programmable logic device, the method comprising the steps of:

receiving a first external clock signal with the programmable logic device;

routing the first external clock signal through the programmable logic device along a clock path with an associated delay, thereby creating an internal distributed clock signal;

providing the internal distributed clock signal to a phase comparator located on the programmable logic device;

providing a second external clock signal to the phase comparator;

generating a first control signal with the phase comparator, the first control signal being representative of a phase difference between the internal distributed clock signal and the second external clock signal; and routing the first control signal off of the programmable logic device for further processing.

12. The method of claim 11, further comprising the steps of:

providing the first control signal to a loop filter;

generating a second control signal with the loop filter in response to the first control signal;

providing the second control signal to a voltage controlled oscillator; and generating the first external clock signal in response to the second control signal.

\* \* \* \* \*